(12) United States Patent
Kim et al.

(10) Patent No.: US 11,482,507 B2
(45) Date of Patent: Oct. 25, 2022

(54) SEMICONDUCTOR PACKAGE HAVING MOLDING MEMBER AND HEAT DISSIPATION MEMBER

(71) Applicant: SAMSUNG ELECTRONICS CO., LTD., Suwon-si (KR)

(72) Inventors: Sunchul Kim, Hwaseong-si (KR); Kyungsuk Oh, Seongnam-si (KR); Taehun Kim, Asan-si (KR); Pyoungwan Kim, Suwon-si (KR); Soohwan Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 14 days.

(21) Appl. No.: 16/816,593

(22) Filed: Mar. 12, 2020

(65) Prior Publication Data
US 2021/0057380 A1 Feb. 25, 2021

(30) Foreign Application Priority Data
Aug. 22, 2019 (KR) .................. 10-2019-0103344

(51) Int. Cl.
*H01L 23/367* (2006.01)
*H01L 25/065* (2006.01)
*H01L 23/31* (2006.01)
*H01L 25/00* (2006.01)

(52) U.S. Cl.
CPC ...... *H01L 25/0652* (2013.01); *H01L 23/3128* (2013.01); *H01L 23/367* (2013.01); *H01L 25/50* (2013.01); *H01L 2225/0651* (2013.01); *H01L 2225/06517* (2013.01); *H01L 2225/06589* (2013.01)

(58) Field of Classification Search
CPC ..................................................... H01L 23/562
See application file for complete search history.

(56) References Cited

U.S. PATENT DOCUMENTS

| 5,652,461 | A | 7/1997 | Ootsuki et al. |
| 6,177,726 | B1 * | 1/2001 | Manteghi ............ H01L 23/3135 257/666 |
| 6,436,550 | B2 | 8/2002 | Sakata et al. |

(Continued)

FOREIGN PATENT DOCUMENTS

| KR | 10-2000-0073112 A | 12/2000 |
| KR | 10-2007-0063817 A | 6/2007 |
| KR | 10-2015-0142916 A | 12/2015 |

*Primary Examiner* — Nicholas J Tobergte
*Assistant Examiner* — William H Anderson
(74) *Attorney, Agent, or Firm* — Lee IP Law, P.C.

(57) ABSTRACT

A semiconductor package includes a package substrate, a first semiconductor chip disposed on the package substrate, at least one second semiconductor chip disposed on a region of an upper surface of the first semiconductor chip, a heat dissipation member disposed in another region of the upper surface of the first semiconductor chip and at least a region of an upper surface of the second semiconductor chip, and having an upper surface in which at least one trench is formed, and a molding member covering the first semiconductor chip, the second semiconductor chip, an upper surface of the package substrate, and side surfaces of the heat dissipation member, and filling the at least one trench while exposing the upper surface of the heat dissipation member.

11 Claims, 14 Drawing Sheets

(56) References Cited

U.S. PATENT DOCUMENTS

| | | | |
|---|---|---|---|
| 9,978,661 B2* | 5/2018 | Im | H01L 23/562 |
| 10,037,974 B2* | 7/2018 | Chang Chien | H01L 25/0657 |
| 10,643,924 B1* | 5/2020 | Shen | H01L 23/3675 |
| 2003/0011053 A1* | 1/2003 | Yasunaga | H01L 23/4334 |
| | | | 257/678 |
| 2012/0104591 A1* | 5/2012 | Warren | H01L 23/4334 |
| | | | 438/122 |
| 2013/0208426 A1 | 8/2013 | Kim et al. | |
| 2014/0167260 A1* | 6/2014 | Kwon | H01L 25/105 |
| | | | 257/737 |
| 2014/0307390 A1* | 10/2014 | Baker | H01L 23/42 |
| | | | 361/709 |
| 2017/0243855 A1* | 8/2017 | Kim | H01L 25/0657 |
| 2019/0214328 A1* | 7/2019 | Eid | H01L 25/18 |

\* cited by examiner

SEMICONDUCTOR PACKAGE HAVING MOLDING MEMBER AND HEAT DISSIPATION MEMBER

CROSS-REFERENCE TO RELATED APPLICATION

Korean Patent Application No. 10-2019-0103344, filed on Aug. 22, 2019, in the Korean Intellectual Property Office, and entitled: "Semiconductor Package," is incorporated by reference herein in its entirety.

BACKGROUND

1. Field

Embodiments relate to a semiconductor package.

2. Description of the Related Art

With the trend for high functionality and miniaturization of electronic components, high performance and miniaturization of packages have been implemented using a system in package (SIP) technology in which a plurality of semiconductor chips having various functions are embedded in a single package.

SUMMARY

Embodiments are directed to a semiconductor package, including a package substrate, a first semiconductor chip disposed on the package substrate, at least one second semiconductor chip disposed on a region of an upper surface of the first semiconductor chip, a heat dissipation member disposed in another region of the upper surface of the first semiconductor chip and at least a region of an upper surface of the second semiconductor chip, and having an upper surface in which at least one trench is formed, and a molding member covering the first semiconductor chip, the second semiconductor chip, an upper surface of the package substrate, and side surfaces of the heat dissipation member, and filling the at least one trench while exposing the upper surface of the heat dissipation member.

Embodiments are directed to a semiconductor package, including a package substrate, a first semiconductor chip disposed on the package substrate, at least one second semiconductor chip disposed on a region of an upper surface of the first semiconductor chip, an insulating layer disposed on surfaces of the package substrate, the first semiconductor chip, and the second semiconductor chip, a heat dissipation member disposed on the insulating layer, and disposed throughout a region in which at least the first semiconductor chip does not overlap the second semiconductor chip and a region in which at least the first semiconductor chip overlaps the second semiconductor chip, when viewed from above perpendicular to the package substrate, the heat dissipation member having an upper surface in which at least one trench is formed, and a molding member disposed on the package substrate and encapsulating at least a portion of each of the first semiconductor chip, the second semiconductor chip, and the heat dissipation member.

Embodiments are directed to a semiconductor package, including a package substrate, a first semiconductor chip disposed on the package substrate, a heat dissipation member disposed on an upper surface of the first semiconductor chip and having a trench extending along the upper surface of the heat dissipation member in one direction, and a molding member filling the trench.

BRIEF DESCRIPTION OF THE DRAWINGS

Features will become apparent to those of skill in the art by describing in detail example embodiments with reference to the attached drawings in which.

DETAILED DESCRIPTION

Hereinafter, example embodiments will be described with reference to the accompanying drawings.

Figure 1:
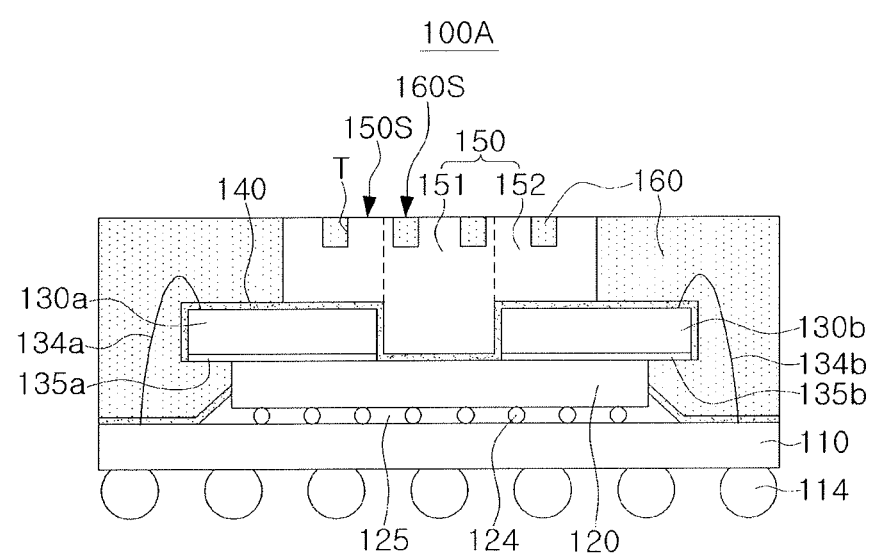
FIG. 1 is a side cross-sectional view of a semiconductor package according to an example embodiment.
Figure 2A:
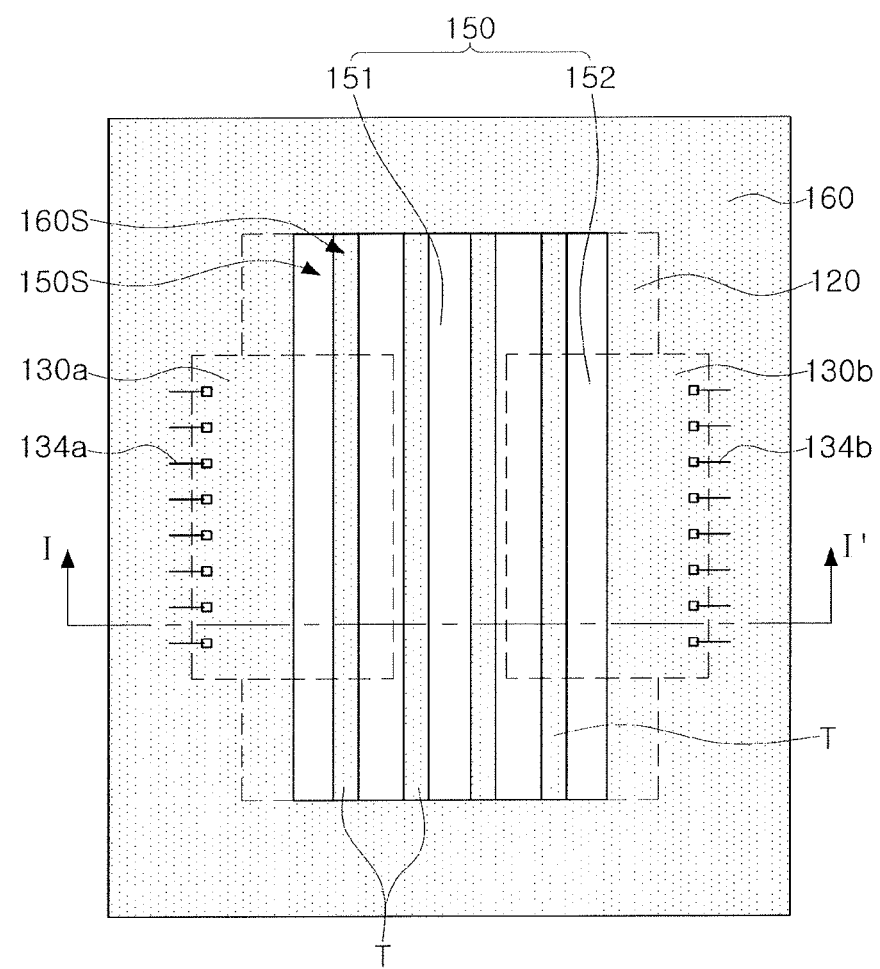
FIG. 2A is a plan view illustrating a partial configuration of the semiconductor package in FIG. 1.

FIG. 1 is a side cross-sectional view of a semiconductor package 100A according to an example embodiment. FIG. 2A is a plan view illustrating a partial configuration of the semiconductor package 100A in FIG. 1. For example, FIG. 1 is a cross-sectional view taken along line I-I' of the partial configuration in FIG. 2A.

Referring to FIGS. 1 and 2A, a semiconductor package 100A according to an example embodiment may include a package substrate 110, a first semiconductor chip 120, at least one second semiconductor chip (for example, a second semiconductor chip 130*a* and/or a second semiconductor chip 130*b*), a heat dissipation member 150, and a molding member 160.

The semiconductor package 100A may be a system in package (SIP) in which various types of semiconductor chips are embedded. For example, the first semiconductor chip 120 may be a logic chip, and the at least one second semiconductor chip 130*a* and 130*b* may be a memory chip.

The package substrate 110 may be a semiconductor package substrate such as a printed circuit board (PCB), a ceramic substrate, a tape wiring substrate, or the like. For example, the package substrate 110 may include a thermosetting resin such as an epoxy resin or a thermoplastic resin such as polyimide, or a photosensitive insulating layer. For example, the substrate may include a material such as prepreg, an Ajinomoto build-up film (ABF), FR-4, bismaleimide triazine (BT), a photoimageable dielectric (PID) resin, or the like.

Although not illustrated the drawings, the package substrate 110 may include a plurality of pads, respectively disposed on upper and lower surfaces opposing each other, and wirings electrically connecting the plurality of pads to each other.

A lower portion of the package substrate 110 may further include connection terminals 114 connected to pads, not illustrated, disposed on the lower surface of the package substrate 110. The connection terminals 114 may be electrically connected to an external device such as a main board. For example, the connection terminals 114 may have a flip-chip connection structure including a solder ball, a conductive bump, or a grid array such as a pin grid array, a ball grid array, or a land grid array.

The first semiconductor chip 120 may be disposed on the upper surface of the package substrate 110 and may be electrically connected to a pad, not illustrated, disposed on the upper surface of the package substrate 110. For example, the first semiconductor chip 120 may be mounted on the package substrate 110 through connection members 124, disposed on connection electrodes, not illustrated, disposed on an active surface (a lower surface of "120" in FIG. 1), in a flip-chip bonding manner. An underfill resin 125, including an epoxy resin, or the like, covering the connection members 124, may be formed between the active surface of the first semiconductor chip 120 and the upper surface of the package substrate 110.

In other example embodiments, the first semiconductor chip 120 may be mounted on the package substrate 110 in a wire-bonding manner.

The first semiconductor chip 120 may include, for example, a system large scale integration (LSI), a logic circuit, a CMOS imaging sensor (CIS), and the like.

The at least one second semiconductor chip 130a and 130b (hereinafter, at least one second semiconductor chip 130a and 130b may be referred to as "second semiconductor chips 130a and 130b") may be disposed on a portion of the upper surface of the first semiconductor chip 120. For example, the at least one second semiconductor chip 130a and 130b may be disposed on the first semiconductor chip 120 to expose at least a portion of the first semiconductor chip 120. For example, the at least one second semiconductor chip 130a and 130b may be disposed on the first semiconductor chip 120 to cover a portion of the upper surface of the first semiconductor chip 120, when viewed from above (perpendicular to the package substrate 110). The at least one second semiconductor chip 130a and 130b may partially overlap the first semiconductor chip 120.

For example, a region of the upper surface of the first semiconductor chip 120 may be disposed between a plurality of second semiconductor chips 130a and 130b. For example, the plurality of second semiconductor chips 130a and 130b may be spaced apart from each other on the upper surface of the first semiconductor chip 120 to expose a central portion of the first semiconductor chip 120, when viewed from above. The heat dissipation member 150 (described in detail below) may be formed on the exposed central portion of the first semiconductor chip 120 to effectively dissipate heat, generated in the first semiconductor chip 120, outwardly of the semiconductor package.

Figure 12:
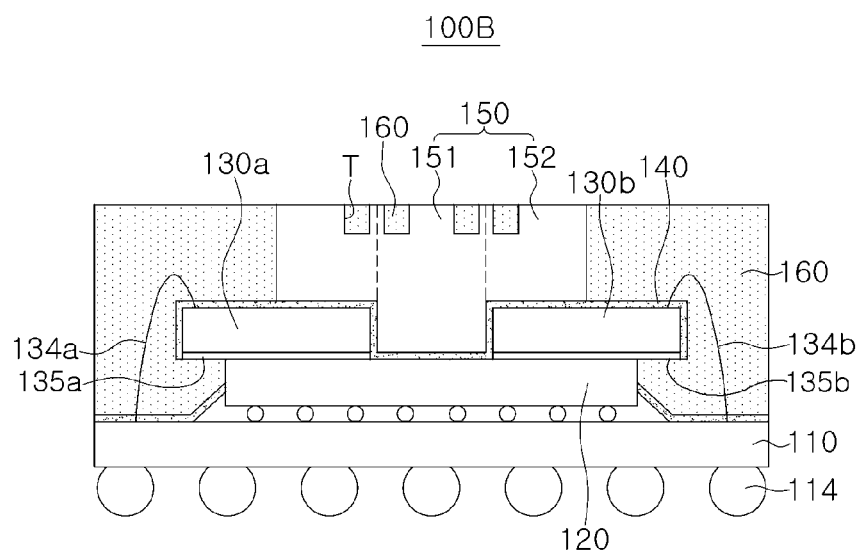
FIG. 12 is a side cross-sectional view illustrating a semiconductor package according to an example embodiment.
Figure 13:
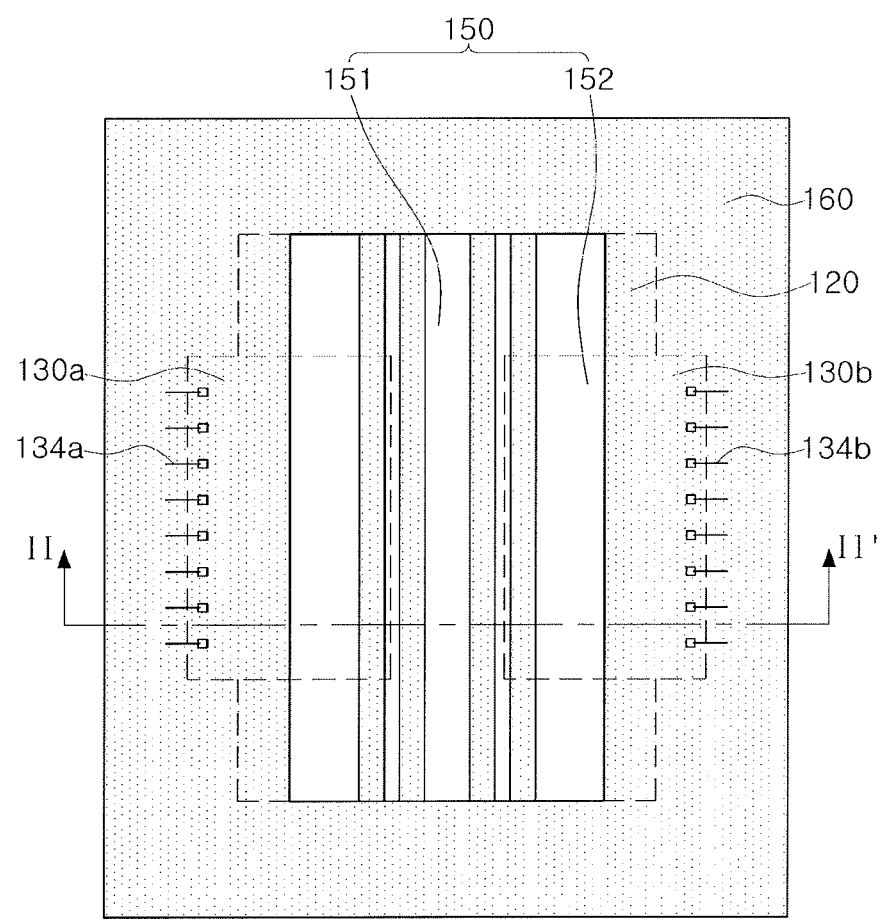
FIG. 13 is a plan view illustrating a partial configuration of the semiconductor package in FIG. 12.
Figure 15:
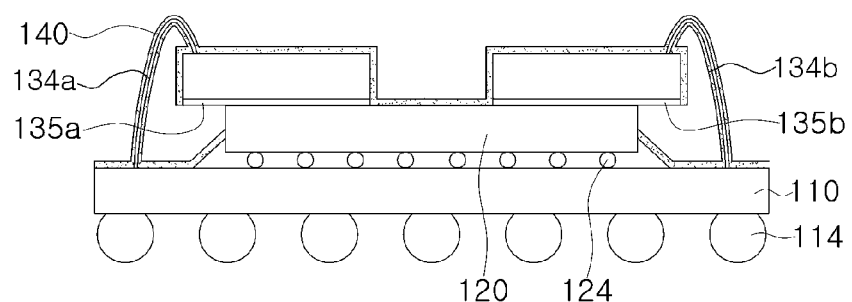
FIGS. 15 and 16 are side cross-sectional views illustrating a portion of a method of manufacturing the semiconductor package in FIG. 14.

In other example embodiments, a single second semiconductor chip 130a may be disposed on one side of the first semiconductor chip 120 (see FIG. 12), or a plurality of second semiconductor chips 130a and 130b may be stacked on one side of the first semiconductor chip 120 (see FIGS. 13 and 15).

The at least one second semiconductor chip 130a and 130b may be electrically connected to the package substrate 110 by bonding wires 134a and 134b. In another example embodiment, the at least one second semiconductor chip 130a and 130b, disposed on the first semiconductor chip 120, may be electrically connected to the first semiconductor chip 120 through a wiring layer or a connection pad, not illustrated, formed on the upper surface of the first semiconductor chip 120.

The at least one second semiconductor chip 130a and 130b may be attached onto the first semiconductor chip 120 by attachment members 135a and 135b. The attachment members 135a and 135b may include a polymeric material having good thermal conductivity. For example, the attachment members 135a and 135b may be a thermally conductive adhesive tape, a thermally conductive grease, a thermally conductive adhesive, or the like.

The at least one second semiconductor chip 130a and 130b may include a memory chip such as a DRAM, an SRAM, a flash memory, a PRAM, an ReRAM, an FeRAM, an MRAM, a high bandwidth memory (HBM), a hybrid memory cubic (HMC), or the like.

The above-described type, number, disposition, and the like of the first and second semiconductor chips are merely examples and may be varied.

An insulating layer 140 may be further provided on surfaces of the first semiconductor chip 120 and the second semiconductor chips 130a and 130b. The insulating layer 140 may be conformally coated on the entire exposed surface of the package substrate 110, the first semiconductor chip 120, and the second semiconductor chips 130a and 130b. Accordingly, the insulating layer 140 may be coated on the upper surface of the package substrate 110, an upper surface and at least a portion of a side surface of the first semiconductor chip 120, on which the second semiconductor chips 130a and 130b are not disposed, and the upper surface and a side surface of the second semiconductor chips 130a and 130b. The insulating layer 140 may be conformally coated on the first semiconductor chip 120 and the second semiconductor chips 130a and 130b to prevent a short-circuit between the heat dissipation member 150, and the first semiconductor chip 120 and the second semiconductor chips 130a and 130b when the heat dissipation member 150 is formed on the first semiconductor chip 120 and the second semiconductor chips 130a and 130b.

The insulating layer 140 may include an electrically insulating material having good thermal conductivity. For example, the insulating layer 140 may include silica ($SiO_2$), an aluminum oxide ($Al_2O_3$), a boron nitride (BN), an aluminum nitride (AlN), a ceramic coated metal ball, or the like.

The heat dissipation member 150 may be disposed on the insulating layer 140, and may be located on another region of the upper surface of the first semiconductor chip 120, in which the second semiconductor chips 130a and 130b is not disposed, and at least a region of the upper surface of the second semiconductor chips 130a and 130b.

For example, the heat dissipation member 150 may have a first region 151 formed on the first semiconductor chip 120 exposed by the second semiconductor chips 130a and 130b, and a second region 152 formed on the second semiconductor chips 130a and 130b. The heat dissipation member 150 may be disposed on the insulating layer 140 and may be formed throughout a region in which the first semiconductor chip 120 overlaps the second semiconductor chips 130a and 130b, and a region in which the first semiconductor chip 120 does not overlap the second semiconductor chips 130a and 130b, when viewed from above.

The heat dissipation member 150 may have at least one trench T in an upper surface thereof. The at least one trench T (hereinafter, at least one trench T may be referred to as "trench T") may be continuously formed from one end of the heat dissipation member 150 to the other end opposing the one end. Accordingly, the trench T may have a shape in which a plurality of trenches T are arranged side by side on the upper surface of the heat dissipation member 150 in one direction. A lower surface of the trench T may be disposed on a level lower than an upper surface of the heat dissipation member 150. The trench T may be filled with the molding member 160. Thus, the lower surface and an internal wall surface of the trench T may be in contact with the molding member 160.

The trench T may reduce a total area of the upper surface of the heat dissipation member 150 that is exposed by the molding member 160 (that is, not covered with the molding member 160). According to the present example embodiment, cracking may be prevented from occurring in the upper surface of the heat dissipation member 150.

When viewed from above, a total area of the molding member 160 filling the trench T may have a ratio of 1:2 to 2:1 with respect to the total area of the exposed upper surface of the heat dissipation member 150. When a ratio of the total area of the upper surface of the molding member 160 filling the trench T to the total area of the exposed upper surface of the heat dissipation member 150 is less than 1:2, a cracking prevention effect may be reduced. When the ratio of the total area of the upper surface of the molding member 160 filling the trench T to the total area of the exposed upper surface of the heat dissipation member 150 is greater than 2:1, the area of the exposed upper surface of the heat dissipation member 150 may be reduced, which may lead to a decrease in heat dissipation performance.

The trench T may be formed in not only a portion of the upper surface of the heat dissipation member 150 vertically overlapping the upper surfaces of the plurality of second semiconductor chips 130a and 130b (an upper surface of the second region 152) but also a portion of the upper surface of the heat dissipation member 150 corresponding to a space between the plurality of second semiconductor chips 130a and 130b (an upper surface of the first region 151).

The first region 151 may be formed directly on the first semiconductor chip 120 to dissipate a large amount of heat generated in the first semiconductor chip 120. The second region 152 may be formed directly on the second semiconductor chips 130a and 130b to dissipate heat generated in the second semiconductor chips 130a and 130b, and heat transferred from the first region 151 and generated in the first semiconductor chip 120.

An area of the first region 151 may be larger than an area of the second region 152, when viewed from above. The heat dissipation performance may be improved by securing the area of the first region 151 that is formed directly on the first semiconductor chip 120, which may have a relatively larger heat dissipation amount than the second semiconductor chips 130a and 130b.

The first region 151 and the second region 152 of the heat dissipation member 150 may be integrally formed. Accordingly, upper surfaces of each of the first region 151 and the second region 152 may be disposed on the same level. The first region 151 may be in contact with at least a portion of the insulating layer 140, coated on the upper surface of the first semiconductor chip 120, and at least a portion of the insulating layer 140 coated on side surfaces of the second semiconductor chips 130a and 130b. The second region 152 may be in contact with at least a portion of the insulating layer 140 coated on the upper surfaces of the second semiconductor chips 130a and 130b.

The heat dissipation member 150 may include a metal such as gold (Au), silver (Ag), copper (Cu), or the like, or a conductive material such as graphite, graphene, or the like.

The molding member 160 may be disposed on the package substrate 110, and may cover the first semiconductor chip 120, the second semiconductor chips 130a and 130b, an upper surface of the package substrate, and side surfaces of the heat dissipation member 150 to expose at least a portion of the upper surface of the heat dissipation member. For example, the molding member 160 may cover the side surface of the heat dissipation member 150, may fill the trench T of the heat dissipation member 150, and may expose the upper surface of the heat dissipation member 150. For example, the upper surface 150S of the heat dissipation member 150 may be disposed on the same level as the upper surface 160S of the molding member 160 filling the trench T, and the lower surface of the trench T may be may be disposed on a level lower than a level of the upper surface of the heat dissipation member 150 and an upper surface of the molding member 160, not filling the trench T.

The molding member 160 may include an insulating material. For example, the insulating material of the molding member 160 may be an epoxy molding compound (EMC), or the like.

As described above, the semiconductor package 100A according to an example embodiment may include the heat dissipation member 150 having the first region 151 formed on the first semiconductor chip 120 and the second region 152 formed on the second semiconductor chips 130a and 130b, and having at least one trench T formed on the upper surface of the heat dissipation member 150.

The first region 151 of the heat dissipation member 150 may be formed on the first semiconductor chip 120 and the upper surface of the heat dissipation member 150 may be exposed, so that heat generated in the first semiconductor chip 120 (having a relatively high heat dissipation amount), may be effectively dissipated through the first region 151 of the heat dissipation member 150.

The exposed upper surface 150S of the heat dissipation member 150 may be cracked by external impacts or warpage. The trench T that is formed on the upper surface of the heat dissipation member 150 may be filled with the molding member 160. Thus, an area of the exposed upper surface of the heat dissipation member 150 may be reduced, which may help prevent deformation of the heat dissipation member 150 or damage to the heat dissipation member 150.

Figure 2B:
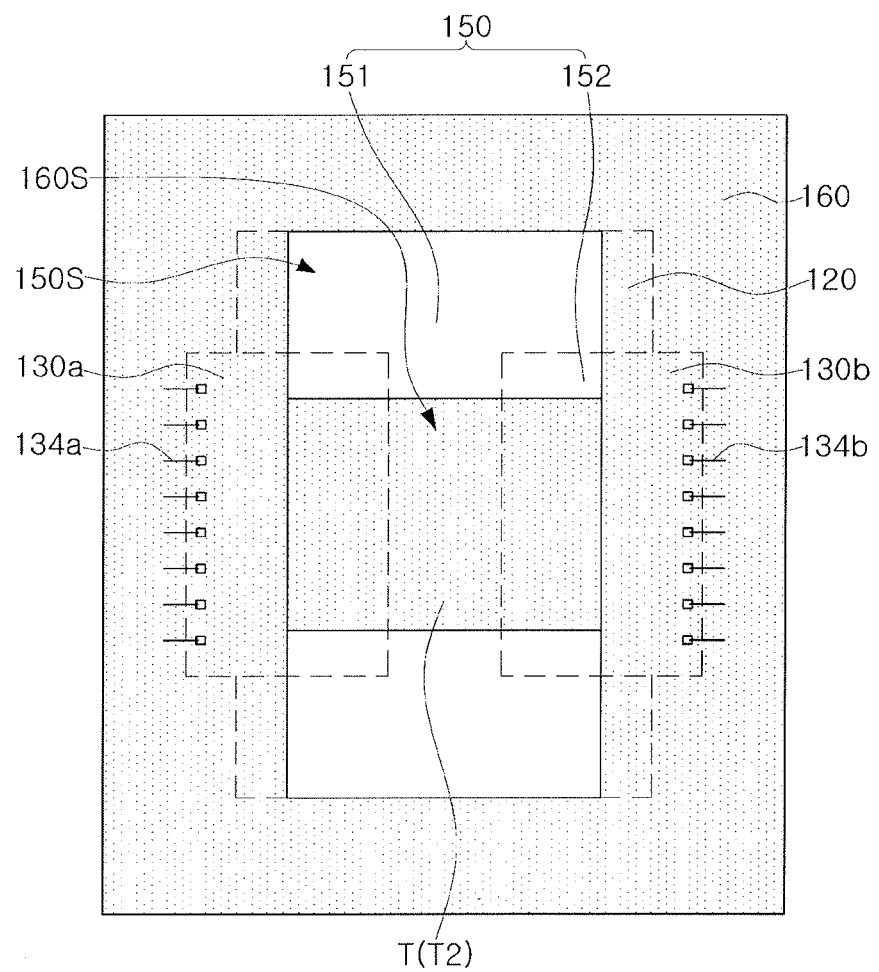
FIGS. 2B to 2D are plan views illustrating structures of a trench according to example embodiments.
Figure 2C:
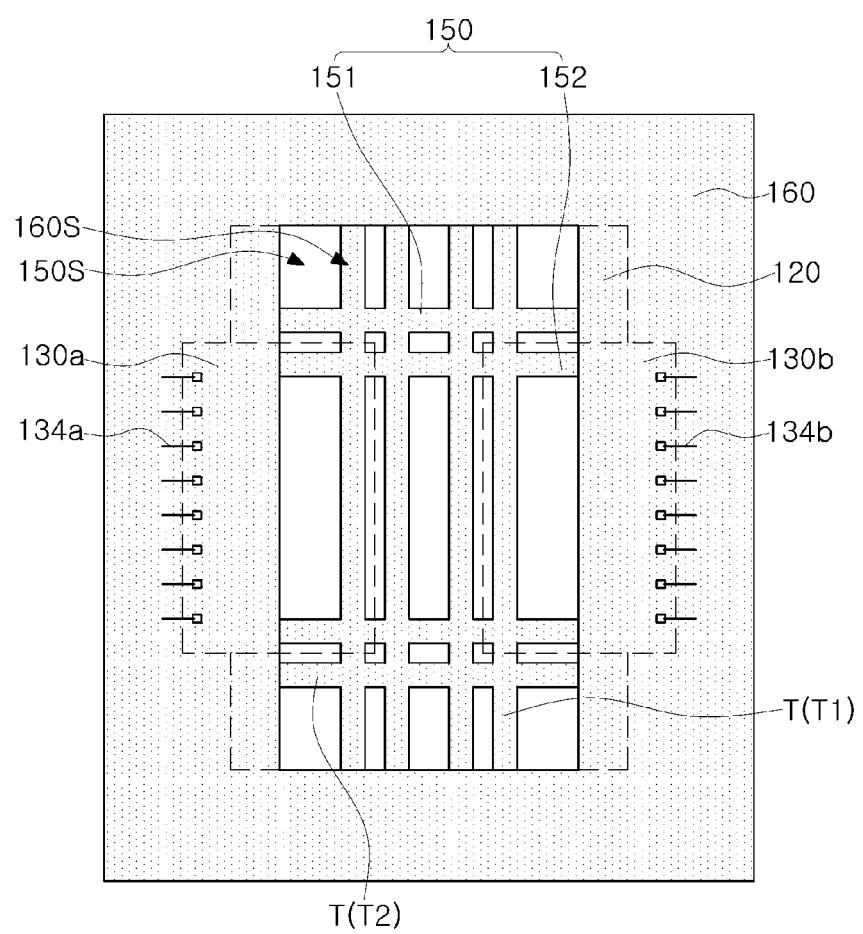
Figure 2D:
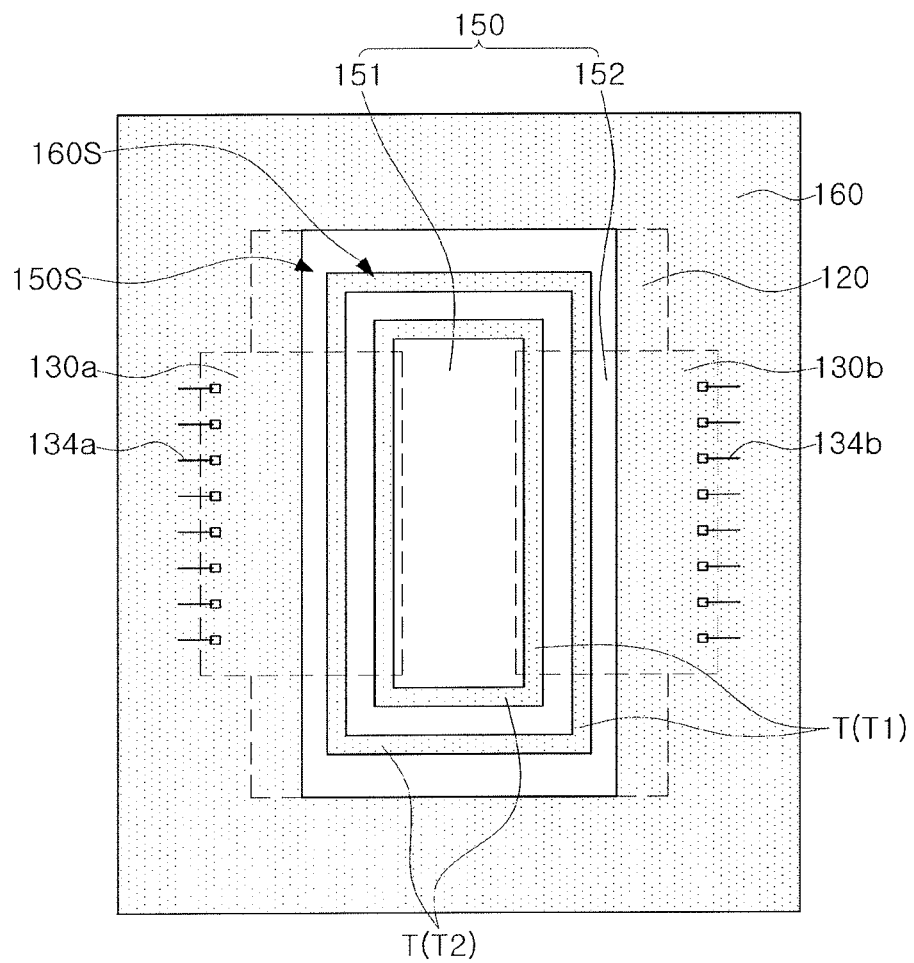

FIGS. 2B to 2D are plan views illustrating structures of the trench T according to example embodiments.

Referring to FIG. 2B, as an example, the trench T may be a single trench T2 extending along the upper surface of the heat dissipation member 150 in one direction. For example, the single trench T2 may extend in a direction connecting second regions 152 in which the heat dissipation member 150 overlaps the second semiconductor chips 130a and 130b disposed parallel to each other, when viewed from above.

Referring to FIG. 2C, as an example, the trench T may include a first trench T1 that extends along the upper surface of the heat dissipation member 150 in a first direction, and may include a second trench T2 that extends along the upper surface of the heat dissipation member 150 in a second direction. The first trench T1 and the second trench T2 may intersect each other. For example, the first trenches T1 and the second trenches T2 may be densely arranged based on a boundary between the first region 151 and the second region 152 of the heat dissipation member 150, and may intersect each other in the boundary between the first region 151 and the second region 152 of the heat dissipation member 150.

Referring to FIG. 2D, as an example, the trench T may include a first trench T1 that extends along the upper surface of the heat dissipation member 150 in a first direction, and may include a second trench T2 that extends along the upper surface of the heat dissipation member 150 in a second direction. The first trenches T1 and the second trenches T2 may be disposed, for example, in the form of a lattice or rectangular rings surrounding a central portion of the first semiconductor chip 120, when viewed from above. For example, in FIG. 2D, first trenches T1 extending in a vertical direction may be connected to second trenches T2 extending in a horizontal direction to be disposed on the upper surface of the heat dissipation member 150.

The above-described disposition structures of the trench T are provided as examples. In semiconductor packages according to example embodiments, the disposition structure, shape, number, and the like, of trenches T may be variously modified.

FIGS. 3 to 10 are side cross-sectional views illustrating a method of manufacturing the semiconductor package in FIG. 1.

Figure 3:
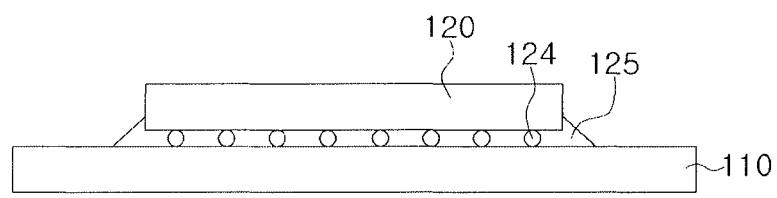
FIGS. 3 to 10 are side cross-sectional views illustrating a method of manufacturing the semiconductor package in FIG. 1.

Referring to FIG. 3, a first semiconductor chip 120 may be mounted on an upper surface of a package substrate 110. The package substrate 100 may include a printed circuit board (PCB), a ceramic substrate, or the like.

The first semiconductor chip 120 may be mounted on the package substrate 110 in a flip-chip bonding manner. The first semiconductor chip 120 may be electrically connected to the package substrate 110 through connection members 124. The connection members 124 may be solder balls and may be connected to pads, not illustrated, disposed on an upper surface of the package substrate 110.

An underfill resin 125 for encapsulating and supporting the connection members 124 may be formed between the first semiconductor chip 120 and the package substrate 110.

Figure 4:
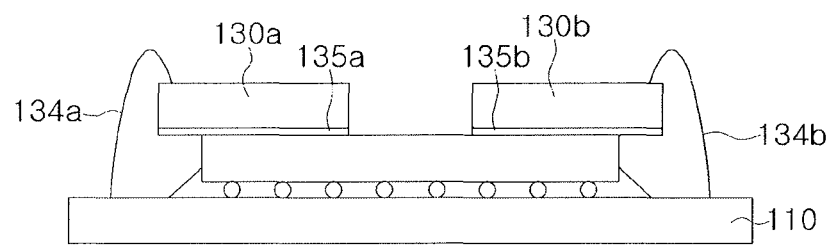

Referring to FIG. 4, second semiconductor chips 130a and 130b may be spaced apart from each other on an upper surface of the first semiconductor chip 120 to expose a central portion of the first semiconductor chip 120. The second semiconductor chips 130a and 130b may partially overlap the first semiconductor chip 120, when viewed from above.

The second semiconductor chips 130a and 130b may be attached onto the first semiconductor chip 120 by attachment members 135a and 135b. The attachment members 135a and 135b may include a polymeric material having good thermal conductivity.

The second semiconductor chips 130a and 130b may be electrically connected to the package substrate 110, for example, in a wire bonding manner. The second semiconductor chips 130a and 130b may be connected to pads, not illustrated, disposed on the package substrate 110 by bonding wires 134a and 134b.

Figure 5:
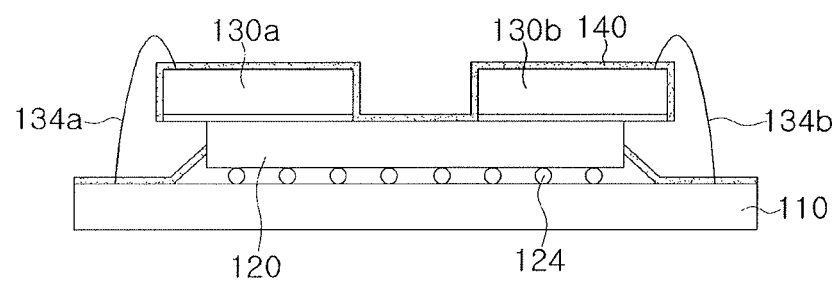

Referring to FIG. 5, an insulating layer 140 may be formed on the package substrate 110, the first semiconductor chip 120, and the second semiconductor chips 130a and 130b. For example, the insulating layer 140 may be conformally applied on entire exposed surfaces of the package substrate 110, the first semiconductor chip 120, and the second semiconductor chips 130a and 130b by a spray coating process.

The insulating layer 140 may be formed to have a uniform thickness, and may be continuously formed on an upper surface of the package substrate 110, an upper surface and at least a portion of side surfaces of the first semiconductor chip 120 on which the second semiconductor chips 130a and 130b are not disposed, and upper surfaces and side surfaces of the second semiconductor chips 130a and 130b.

The insulating layer 140 may include silica ($SiO_2$), an aluminum oxide ($Al_2O_3$), a boron nitride (BN), an aluminum nitride (AlN), a ceramic coated metal ball, or the like, having good thermal conductivity.

Figure 6:
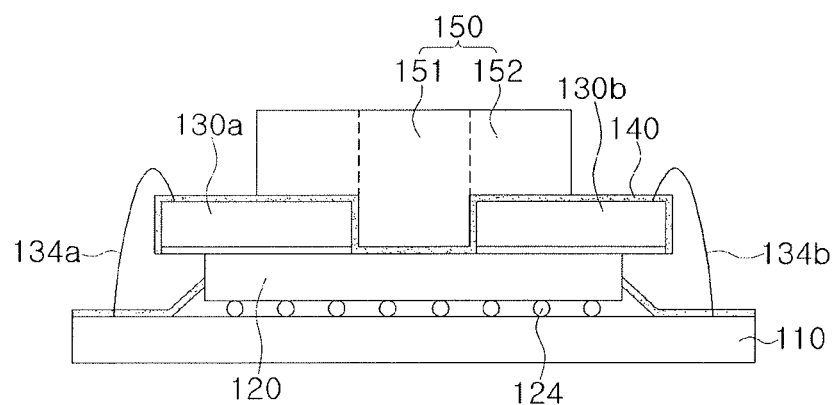

Referring to FIG. 6, a heat dissipation member 150 may be formed on the insulating layer 140 coated on the first semiconductor chip 120 and the insulating layer 140 coated on the second semiconductor chips 130a and 130b.

The heat dissipation member 150 may have a first region 151, formed on the insulating layer 140 coated on the first semiconductor chip 120, and a second region 152 formed on the insulating layer 140 coated on the second semiconductor chips 130a and 130b.

The heat dissipation member 150 may be formed by placement in a dispensing process, using a screen-printing process, or the like. For example, the first region 151 and the second region 152 may be formed by continuously or repeatedly (twice or more times) dispensing a metal paste on the insulating layer 140 that coats the first semiconductor chip 120, and on the insulating layer 140 that coats the second semiconductor chips 130a and 130b. Thus, the first region 151 and the second region 152 may be integrally formed.

The heat dissipation member 150 may include a metal material having good thermal conductivity. The heat dissipation member 150 may be formed on the insulating layers 140 that is coated on the first semiconductor chip 120 and the second semiconductor chips 130a and 130b. Thus, a short-circuit with the first semiconductor chip 120 and the second semiconductor chips 130a and 130b may be prevented.

Figure 7:
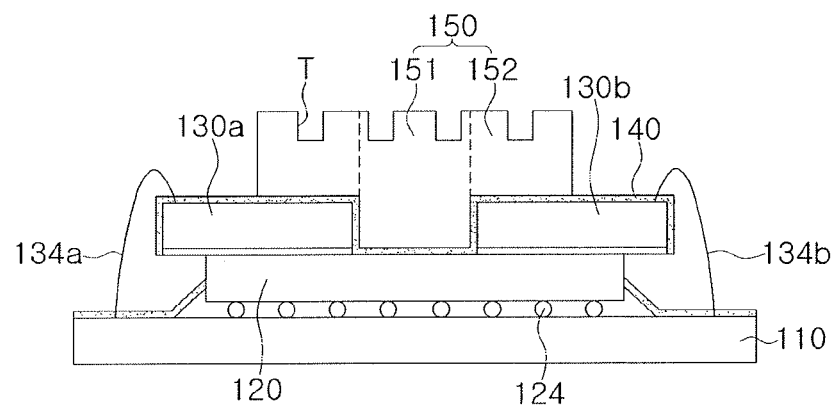

Referring to FIG. 7, at least one trench T may be formed in an upper surface of the heat dissipation member 150, for example, before or after placement or formation of the heat dissipation member 150. The trench T may be formed using a blade, laser drilling, or the like. The trench T may serve to reduce a total area of the upper surface of the heat dissipation member 150. A total area of a lower surface of the trench T may have a ratio of 1:2 to 2:1 with respect to the total area of the uppermost surface of the heat dissipation member 150. The trench T may be formed on an upper surface of at least one of the first region 151 and the second region 152 of the heat dissipation member 150.

In another example embodiment, the upper portion of the heat dissipation member 150 may be formed to have an uneven or trench shape, without an additional process of forming the trench T, and the heat dissipation member 150 may be placed in the dispensing process. A molding material may be applied to cover the uneven shape.

Figure 8:
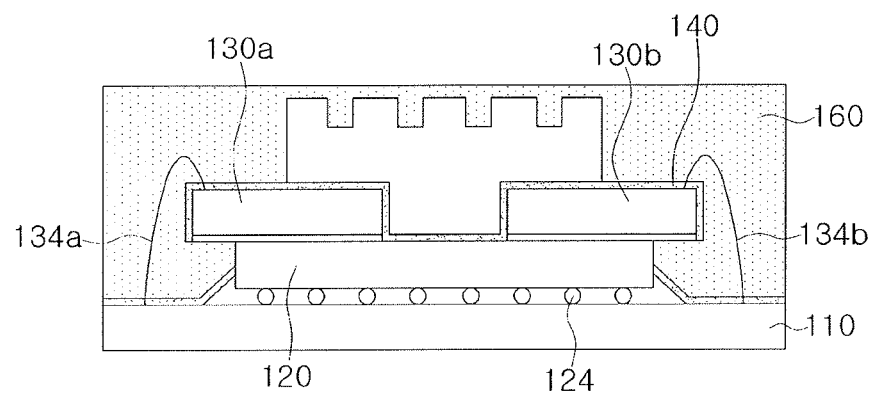

Referring to FIG. 8, a molding member 160 may be formed on the package substrate 110. The molding member 160 may be formed to cover an upper surface of the heat dissipation member 150. For example, the molding member 160 may encapsulate surfaces of the first semiconductor chip 120, the second semiconductor chips 130a and 130b, and the heat dissipation member 150, and may fill the trench T of the heat dissipation member 150.

Figure 9:
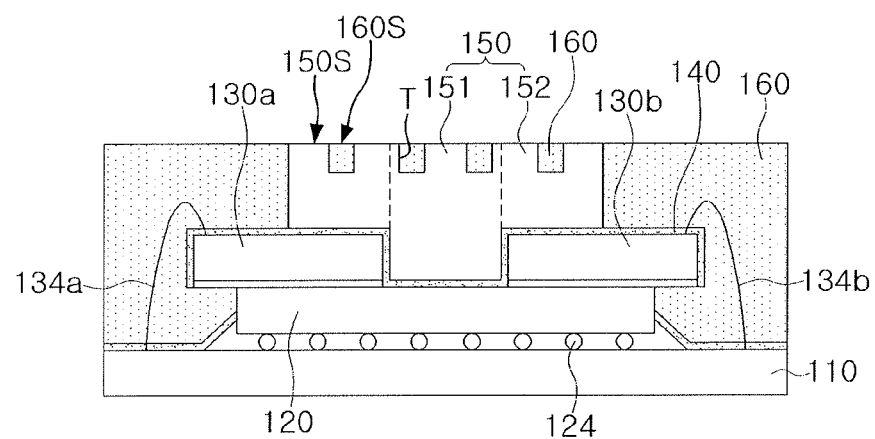
Figure 10:
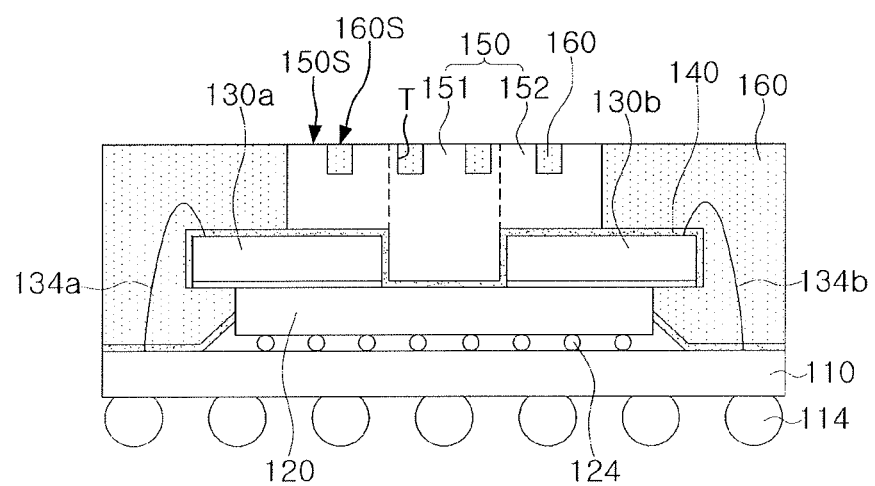

Referring to FIGS. 9 and 10, an upper portion of the heat dissipation member 150 may be ground or removed to expose an upper surface of the molding member 160. For example, a portion of the molding member 160 that covers the upper portion of the heat dissipation member 150 may be ground to alternately expose an upper surface 150S of the heating dissipation member 150 and an upper surface 160S of the molding member 160. Thus, the upper surface 150S of the heat dissipation member 150 and the upper surface 160S of the molding member 160 filling the trench T may be disposed on a same level.

Next, connection terminals 114 may be formed below the package substrate 110. The connection terminals 114 may be connected to pads, not illustrated, disposed on a lower surface of the package substrate 110. The connection terminals 114 may be solder balls.

Figure 11:
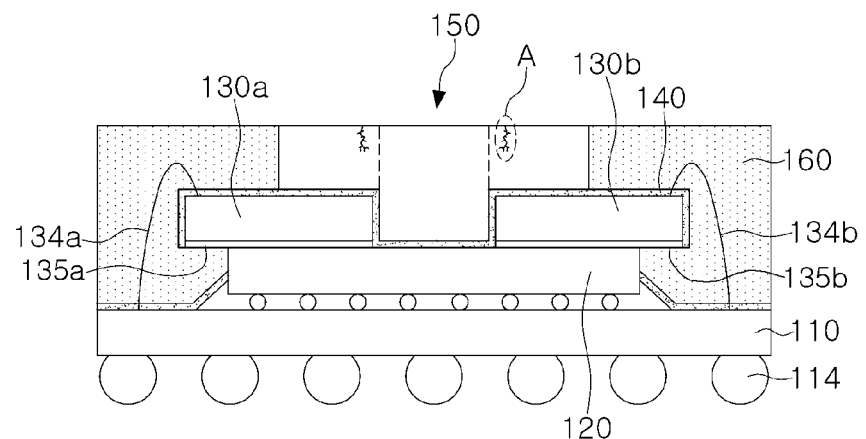
FIG. 11 is a cross-sectional view illustrating cracking occurring in a comparative heat dissipation member when no trench is formed.

FIG. 11 is a cross-sectional view illustrating cracking occurring in a comparative heat dissipation member when no trench is formed.

Referring to FIG. 11, when the molding member 160 completely exposes the upper surface of the heat dissipation member 150, for example, to maximize a heat dissipation path, cracking (indicated by 'A') may occur in the upper surface of the heat dissipation member 150 in an external impact or thermal cycle test. In contrast, in example embodiments, the trench T may be formed on the upper surface of the heat dissipation member 150, and the molding member 160 may fill the trench T. Thus, in example embodiments, an exposed upper surface of the heat dissipation member 150 may be reduced to prevent damage to the upper surface of the heat dissipation member 150.

FIG. 12 is a side cross-sectional view illustrating a semiconductor package 100B according to an example embodiment, and FIG. 13 is a plan view illustrating a partial configuration of the semiconductor package 100B in FIG. 12. For example, FIG. 12 is a cross-sectional view taken along line I-I' of the partial configuration in FIG. 13.

Referring to FIGS. 12 and 13, in a semiconductor package 100B according to an example embodiment, a trench T may be densely arranged based on a boundary between the first region 151 and the second region 152. For example, the trenches T may be densely arranged in a boundary between a first region 151 of the heat dissipation member 150, formed on a region of an upper surface of the first semiconductor chip 120 on which the second semiconductor chips 130a and 130b are not disposed, and a second region 152 of the heat dissipation member 150 formed on at least a region of upper surfaces of the second semiconductor chip 130a and 130b.

Cracking in the upper surface of the heat dissipation member 150 may be most prone to occur in a boundary portion between the first region 151 and the second region 152 of the heat dissipation member 150. Accordingly, in the semiconductor package 100B according to an example embodiment, trenches T may be concentrated in the boundary portion between the first region 151 and the second region 152 to effectively prevent damage to the surface of the heat dissipation member 150. The description of the components of this embodiment may be understood with reference to the descriptions of the same or similar components of the semiconductor package 100A illustrated in FIG. 1.

Figure 14:
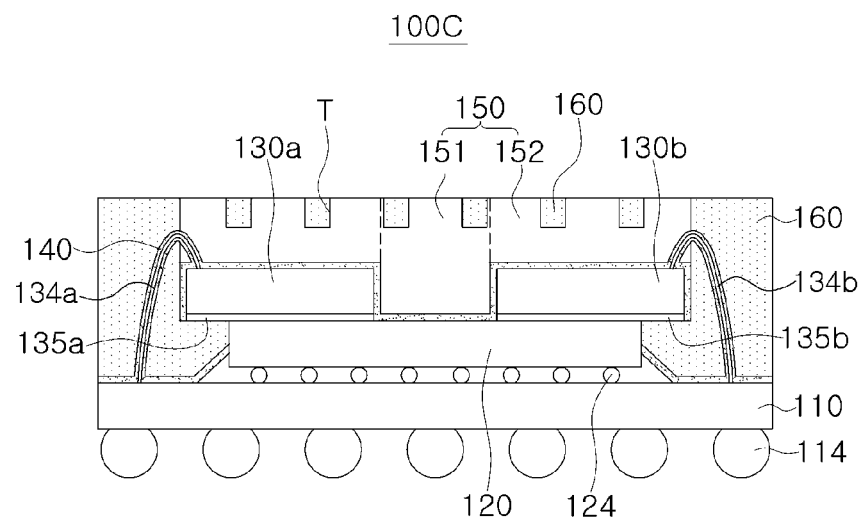
FIG. 14 is a side cross-sectional view of a semiconductor package according to an example embodiment.

FIG. 14 is a side cross-sectional view of a semiconductor package 100C according to an example embodiment.

Referring to FIG. 14, in the semiconductor package 100C according to an example embodiment, an insulating layer 140 may be coated on surfaces of the bonding wires 134a and 134b, and a heat dissipation member 150 may cover the bonding wires 134a and 134b.

The insulating layer 140 may be coated on the surfaces of the bonding wires 134a and 134b. For example, an insulating material may be applied on entire exposed surfaces of a package substrate 110, a first semiconductor chip 120, and a second semiconductor chips 130a and 130b in a spray coating process. Accordingly, even when a second region 152 of the heat dissipation member 150 is formed to cover the bonding wires 134a and 134b, the bonding wires 134a and 134b and the heat dissipation member 150 may be electrically insulated by the insulating layer 140.

The second region 152 (above the second semiconductor chips 130a and 130b in the heat dissipation member 150) may be formed to cover most of upper surface of the second semiconductor chips 130a and 130b, when viewed from above. The second region 152 may extend to a region in which the bonding wires 134a and 134b are disposed, and may cover portions of surfaces of the bonding wires 134a and 134b coated with the insulating layer 140. As a result, an area of a region, in which the heat dissipation member 150 is formed, may be increased to further improve heat dissipation performance.

The description of the components of this embodiment may be understood with reference to the descriptions of the same or similar components of the semiconductor package 100A illustrated in FIG. 1.

Figure 16:
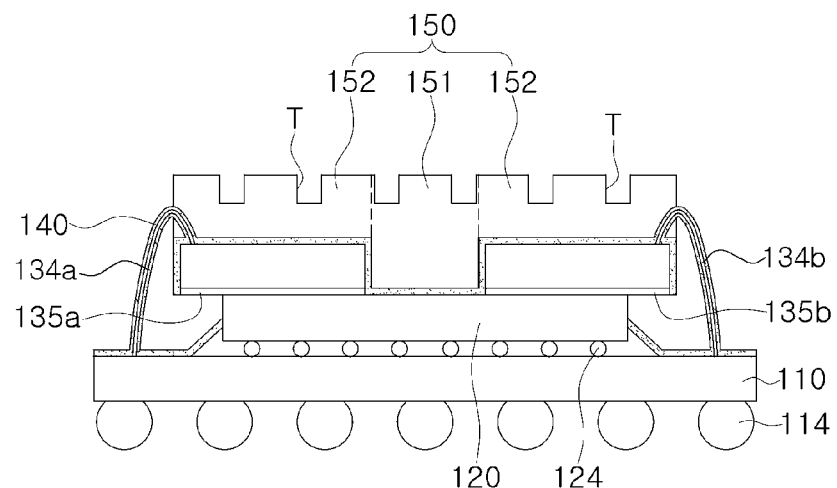

FIGS. 15 and 16 are side cross-sectional views illustrating a portion of a method of manufacturing the semiconductor package 100C in FIG. 14.

By the same or similar method as described in FIGS. 3 and 4, a first semiconductor chip 120 may be mounted on a package substrate 110, second semiconductor chips 130a and 130b may be disposed on the first semiconductor chip 120, and the second semiconductor chips 130a and 130b may be electrically connected to the package substrate 110 by bonding wires 134a and 134b.

Referring to FIG. 15, an insulating layer 140 may be formed on surfaces of the package substrate 110, the first semiconductor chip 120 and the second semiconductor chips 130a and 130b, and surfaces of the bonding wires 134a and 134b. For example, an insulating material that constitutes the insulating layer 140 may be conformally applied by a spray coating process on entire exposed surfaces of the package substrate 110, the first semiconductor chip 120, and the second semiconductor chips 130a and 130b, and on the surfaces of the bonding wires 134a and 134b.

Referring to FIG. 16, a second region 152 of the heat dissipation member 150 may be formed to cover a portion of the bonding wires 134a and 134b having surfaces coated by the insulating layer 140. The bonding wires 134a and 134b and the heat dissipation member 150 may be electrically insulated by the insulating layer 140. Thus, the heat dissipation member 150 may be formed to cover most of the upper surfaces of the second semiconductor chips 130a and 130b, when viewed from above. Accordingly, the number of trenches T, formed on the upper surface of the heat dissipation member 150, may be increased. The trench T may be formed by forming an upper portion of the heat dissipation member 150, for example, as a flat surface, and then forming unevenness on the upper surface of the heat dissipation member 150 in a blade sawing process, or the like. In another example embodiment, when the heat dissipation member 150 is formed, an upper portion of the heat dissipation member 150 may be formed to have an uneven shape.

Figure 17:
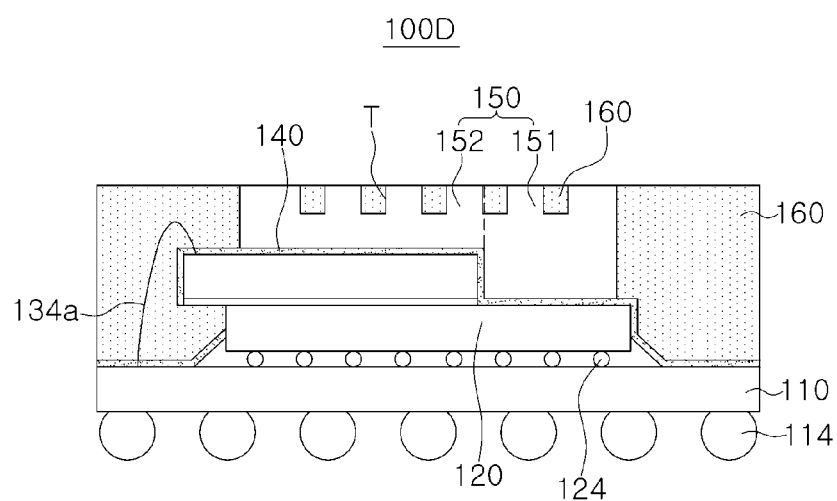
FIG. 17 is a side cross-sectional view of a semiconductor package according to an example embodiment.

FIG. 17 is a side cross-sectional view of a semiconductor package 100D according to an example embodiment.

Referring to FIG. 17, the semiconductor package 100D according to an example embodiment may include a single second semiconductor chip 130a disposed on one side of an upper surface of a first semiconductor chip 120. The second semiconductor chip 130a may be disposed to overlap a portion of the upper surface of the first semiconductor chip 120 such that another portion of the upper surface of the first semiconductor chip 120 is exposed, when viewed from above.

A second region 152 of the heat dissipation member 150 may be formed in a region in which the first semiconductor chip 120 and the second semiconductor chip 130a overlap each other. A first region 151 of the heat dissipation member 150 may be formed in a region in which the first semiconductor chip 120 and the second semiconductor chip 130a do not overlap each other. The description of the components of this embodiment may be understood with reference to the descriptions of the same or similar components of the semiconductor package 100A illustrated in FIG. 1.

Figure 18:
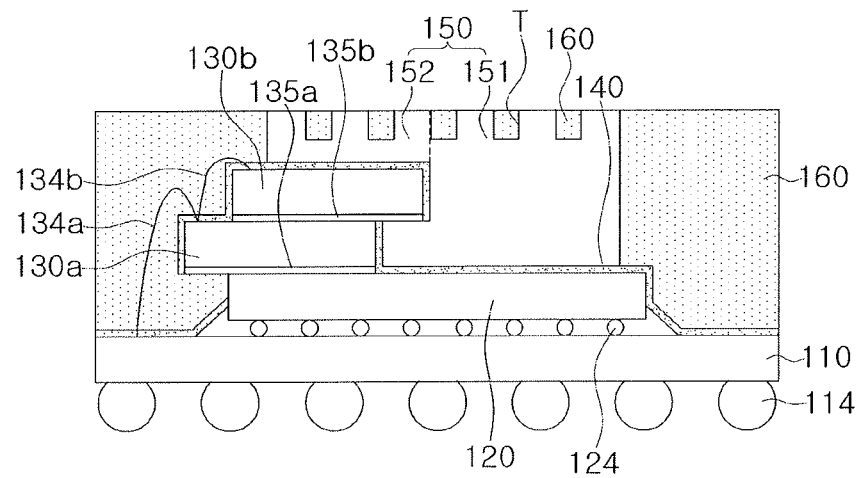
FIG. 18 is a side cross-sectional view of a semiconductor package according to an example embodiment.

FIG. 18 is a side cross-sectional view of a semiconductor package 100E according to an example embodiment.

Referring to FIG. 18, the semiconductor package 100E according to an example embodiment may include a plurality of second semiconductor chips 130a and 130b stacked on one side of a first semiconductor chip 120. The plurality of second semiconductor chips 130a and 130b may be stacked on the first semiconductor chip 120 by attachment members 135a and 135b, respectively. When viewed from above, an exposed area of the first semiconductor chip 120 when the plurality of second semiconductor chips 130a and 130b are stacked on each other may be increased to be larger than that of the first semiconductor chip 120 when the plurality of second semiconductor chips 130a and 130b are disposed side by side in a lateral direction.

The plurality of second semiconductor chips 130a and 130b may be arranged, for example in an offset manner, to expose each connection pad, when viewed from above. The plurality of second semiconductor chips 130a and 130b may be electrically connected to the package substrate 110 by bonding wires 134a and 134b.

A first region 151 of the heat dissipation member 150 may be formed on an insulating layer 140 formed on an upper surface of the first semiconductor chip 120, and a second region 152 of the heat dissipation member 150 may be formed on an insulating layer 140 that is on an upper surface of the overlying stacked second semiconductor chip 130b among the plurality of second semiconductor chips 130a and 130b. As an example, when the insulating layer 140 is coated on surfaces of the bonding wires 134a and 134b, the second region 152 of the heat dissipation member 150 may also be formed on the insulating layer 140 that is on an upper surface of the underlying stacked second semiconductor chip 130a among the plurality of second semiconductor chips 130a and 130b. The description of the components of this embodiment may be understood with reference to the descriptions of the same or similar components of the semiconductor package 100A illustrated in FIG. 1.

Figure 19:
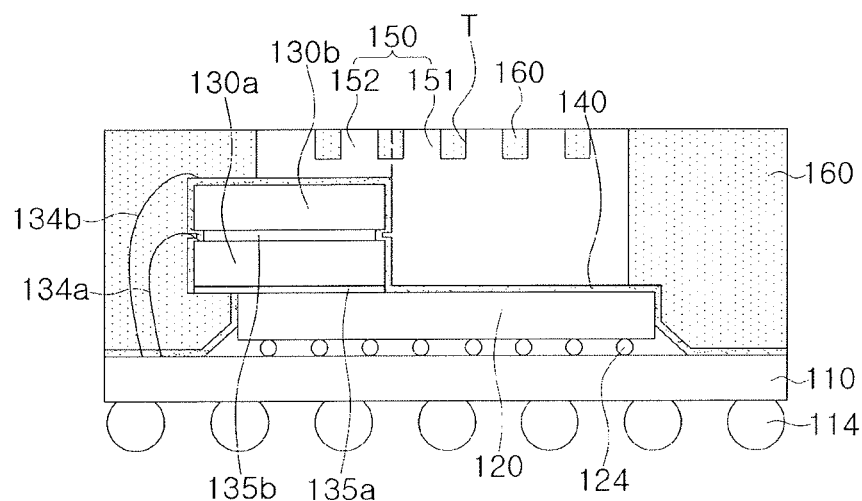
FIG. 19 is a side cross-sectional view of a semiconductor package according to an example embodiment.

FIG. 19 is a side cross-sectional view of a semiconductor package 100F according to an example embodiment.

Referring to FIG. 19, the semiconductor package 100F according to an example embodiment may include a plurality of second semiconductor chips 130a and 130b stacked on one side of a first semiconductor chip 120 to overlap each other, for example without an offset. The plurality of second semiconductor chips 130a and 130b may be stacked on the first semiconductor chip 120 by attachment members 135a and 135b, respectively.

The plurality of second semiconductor chips 130a and 130b may be disposed to overlap, for example entirely overlap, each other when viewed from above. In this case, an area of the first semiconductor chip 120 exposed on a plane may be increased to be larger than that of the first semiconductor chip 120 than when the plurality of second semiconductor chips 130a and 130b are alternately disposed. The plurality of second semiconductor chips 130a and 130b may be electrically connected to the package substrate 110 by bonding wires 134a and 134b.

A first region 151 of the heat dissipation member 150 may be formed on an insulating layer 140 that is formed on an upper surface of the first semiconductor chip 120. A second region 152 of the heat dissipation member 150 may be formed on an insulating layer 140 that is formed on an upper of an overlying staked second semiconductor chip 130b among the plurality of second semiconductor chips 130a and 130b. The description of the components of this embodiment may be understood with reference to the descriptions of the same or similar components of the semiconductor package 100A illustrated in FIG. 1.

Among the above-described various embodiments, two or more embodiments may be combined with each other.

By way of summation and review, in a system in package (SIP), a heat dissipation path may be limited by other semiconductor chips embedded with a semiconductor chip in which significant heat generation occurs, for example, a logic chip. Therefore, it may be difficult to dissipate heat, generated in a package, outwardly of the package. In addition, warpage or cracking may occur due to a difference in coefficients of thermal expansion (CTE) between a plurality of semiconductor chips and other materials constituting the package.

As described above, embodiments may provide a semiconductor package having enhance reliability by improving heat dissipation performance and suppressing defects such as warpage, cracking, or the like.

As described above, a trench may be formed in an upper surface of a heat dissipation member to improve heat dissipation performance and to suppress a defect such as warpage, cracking, or the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
  a package substrate;
  a first semiconductor chip disposed on the package substrate such that the first semiconductor chip and the package substrate are stacked in a vertical direction, the first semiconductor chip extending in first and second directions parallel to the package substrate;
  a plurality of second semiconductor chips disposed on a first region of an upper surface of the first semiconductor chip, and spaced apart from each other, the plurality of second semiconductor chips exposing a second region of the upper surface of the first semiconductor chip;

a heat dissipation member disposed on the second region of the upper surface of the first semiconductor chips and at least a region of an upper surface of the plurality of second semiconductor chips and having an upper surface in which a plurality of trenches are formed; and a molding member covering the first semiconductor chip, the plurality of second semiconductor chips, an upper surface of the package substrate, and side surfaces of the heat dissipation member, and filling the plurality of trenches while exposing the upper surface of the heat dissipation member, wherein:

the heat dissipation member has a first portion overlapping the second region in the vertical direction and a second portion overlapping the first region in the vertical direction, the plurality of trenches are extended in the first direction, and more densely disposed at a boundary between the first portion and the second portion of the heat dissipation member in the second direction than elsewhere in the upper surface of the heat dissipation member.

2. The semiconductor package as claimed in claim 1, wherein the upper surface of the heat dissipation member is disposed on the same level as an upper surface of the molding member filling the plurality of trenches.

3. The semiconductor package as claimed in claim 1, wherein a total area of an upper surface of the molding member filling the plurality of trenches, has a ratio of 1:2 to 2:1 with respect to a total area of an exposed upper surface of the heat dissipation member, when viewed from above perpendicular to the package substrate.

4. The semiconductor package as claimed in claim 1, wherein:

the plurality of trenches do not penetrate an entire thickness of the heat dissipation member in the vertical direction.

5. The semiconductor package as claimed in claim 1, further comprising an insulating layer disposed on surfaces of the package substrate, the first semiconductor chip, and the plurality of second semiconductor chips, wherein the insulating layer is disposed on the upper surface of the package substrate, the upper surface of the first semiconductor chip, and the upper surface and a side surface of the plurality of second semiconductor chips.

6. The semiconductor package as claimed in claim 5, wherein the plurality of second semiconductor chips are electrically connected to the package substrate by a bonding wire.

7. The semiconductor package as claimed in claim 6, wherein the insulating layer is disposed on a surface of the bonding wire.

8. The semiconductor package as claimed in claim 6, wherein the heat dissipation member covers a portion of the bonding wire.

9. A semiconductor package, comprising:

a package substrate;

a first semiconductor chip disposed on the package substrate such that the first semiconductor chip and the package substrate are stacked in a vertical direction, the first semiconductor chip extending in first and second directions parallel to the package substrate;

at least one second semiconductor chip disposed on a first region of an upper surface of the first semiconductor chip, the at least one second semiconductor chip extending in the second direction over the first region of the upper surface of the first semiconductor chip and exposing a second region of the upper surface of the first semiconductor chip;

a heat dissipation member disposed on the second region of the upper surface of the first semiconductor chip and at least a region of an upper surface of the at least one second semiconductor chip, and having an upper surface in which at least one trench is formed; and a molding member covering the first semiconductor chip, the at least one second semiconductor chip, an upper surface of the package substrate, and side surfaces of the heat dissipation member, and filling the at least one trench while exposing the upper surface of the heat dissipation member, wherein:

the heat dissipation member has a first portion overlapping the second region in the vertical direction and a second portion overlapping the first region in the vertical direction, the at least one trench includes first and second trenches extending in the first direction, and the first and second trenches are more densely disposed in the upper surface of the heat dissipation member at a boundary between the first portion and the second portion of the heat dissipation member in the second direction than elsewhere in the upper surface of the heat dissipation member.

10. The semiconductor package as claimed in claim 9, further comprising a plurality of second semiconductor chips spaced apart from each other on the upper surface of the first semiconductor chip, and wherein:

the trench includes a plurality of trenches, and the plurality of trenches are respectively disposed in a portion of the upper surface of the heat dissipation member, vertically overlapping upper surfaces of the plurality of second semiconductor chips, and more densely disposed at the boundary between the first portion and the second portion of the heat dissipation member in the second direction than elsewhere in the upper surface of the heat dissipation member, and the molding member fills each of the plurality of trenches, and exposes a portion of the upper surface of the heat dissipation member.

11. The semiconductor package as claimed in claim 10, further comprising an insulating layer covering an upper surface of the package substrate, the upper surfaces and side surfaces of the plurality of second semiconductor chips, and the upper surface of the first semiconductor chip exposed between the plurality of second semiconductor chips, and wherein:

the heat dissipation member is in direct contact with at least a portion of the insulating layer covering the upper surfaces and the side surfaces of the plurality of second semiconductor chips.

* * * * *